(12) United States Patent
Fukugami et al.

(10) Patent No.: US 11,294,270 B2
(45) Date of Patent: Apr. 5, 2022

(54) REFLECTIVE PHOTOMASK BLANK AND REFLECTIVE PHOTOMASK

(71) Applicant: TOPPAN PRINTING CO., LTD., Tokyo (JP)

(72) Inventors: Norihito Fukugami, Tokyo (JP); Toru Komizo, Tokyo (JP)

(73) Assignee: TOPPAN PRINTING CO., LTD., Tokyo (JP)

( * ) Notice: Subject to any disclaimer, the term of this patent is extended or adjusted under 35 U.S.C. 154(b) by 164 days.

(21) Appl. No.: 16/626,290

(22) PCT Filed: Jun. 29, 2018

(86) PCT No.: PCT/JP2018/024889
§ 371 (c)(1),
(2) Date: Dec. 23, 2019

(87) PCT Pub. No.: WO2019/009211
PCT Pub. Date: Oct. 1, 2019

(65) Prior Publication Data
US 2020/0159106 A1 May 21, 2020

(30) Foreign Application Priority Data
Jul. 5, 2017 (JP) .............................. JP2017-132026

(51) Int. Cl.
*G03F 1/24* (2012.01)
(52) U.S. Cl.
CPC ...................... *G03F 1/24* (2013.01)
(58) Field of Classification Search
CPC ........................................................ G03F 1/24
USPC ........................................................... 430/5
See application file for complete search history.

(56) References Cited

U.S. PATENT DOCUMENTS

| 9,535,332 | B2 * | 1/2017 | Ruoff ........................ G03F 1/22 |
| 2013/0100428 | A1 | 4/2013 | Ruoff et al. |

FOREIGN PATENT DOCUMENTS

| EP | 2416347 A1 | 2/2012 |
| JP | 2011-176162 A | 9/2011 |
| JP | 2013-532381 A | 8/2013 |

OTHER PUBLICATIONS

International Report on Patentability, International Search Report and Written Opinion for PCT International Application No. PCT/JP2018/024889 with translation, 14 pages, dated Jan. 7, 2020.
Extended European Search Report for European Patent Application EP 18828644.7, 8 pages, Search Report dated Aug. 10, 2020.

* cited by examiner

*Primary Examiner* — Christopher G Young
(74) *Attorney, Agent, or Firm* — Squire Patton Boggs (US) LLP

(57) ABSTRACT

A reflective photomask blank (10) of a first aspect includes a substrate (1); a reflective layer (2) formed on the substrate (1); and a light absorbing layer (4) formed on the reflective layer (2). The light absorbing layer (4) includes a tin oxide film with an atomic ratio (O/Sn) of oxygen (O) to tin (Sn) being more than 1.50 and equal to or less than 2.0, and with a film thickness of 25 nm or more and 45 nm or less. Consequently, the shadowing effect of a reflective photomask for pattern transfer using extreme ultraviolet light as a light source is suppressed or reduced to improve the performance of transfer to a semiconductor substrate, and further, the cleaning resistance of the light absorbing layer is improved.

8 Claims, 8 Drawing Sheets

REFLECTIVE PHOTOMASK BLANK AND REFLECTIVE PHOTOMASK

CROSS-REFERENCE

This application is a 35 U.S.C. 371 filing of International Application No. PCT/JP2018/024889 filed on Jun. 29, 2018, which claims priority to Japanese Application No. JP 2017-132026 filed on Jul. 5, 2017, both of which are incorporated verbatim herein by reference in their entirety, including the specifications, drawings, and the claims.

TECHNICAL FIELD

The present invention relates to a reflective photomask for use in lithography that uses extreme ultraviolet light as a light source, and to a reflective photomask blank for use in producing the reflective photomask.

BACKGROUND ART

With the miniaturization of semiconductor devices, the demand for the miniaturization of the photolithography technology has been increasing in the semiconductor device manufacturing process. The minimum resolution size of a transfer pattern in the photolithography largely depends on the wavelength of an exposure light source and can be reduced as the wavelength decreases. Therefore, in order to realize further miniaturization of transfer patterns, exposure light sources are shifting from conventional ArF excimer lasers (wavelength 193 nm) to EUV (Extreme Ultra Violet) with a wavelength of 13.5 nm.

The EUV is absorbed by most materials at high rates. Therefore, in the EUV lithography, it is not possible to use a refractive optical system that makes use of the transmission of light, and it is also not possible to use a transmissive photomask. Consequently, a reflective photomask is used as a photomask for EUV exposure (an EUV mask).

PTL 1 discloses an EUV photomask obtained by forming a light reflective layer on a glass substrate, the light reflective layer composed of a multilayer film in which molybdenum (Mo) layers and silicon (Si) layers are alternately laminated, forming a light absorbing layer mainly containing tantalum (Ta) on the light reflective layer, and forming a pattern in the light absorbing layer.

Further, as a component constituting an optical system of an exposure apparatus, a lens or a transmission beam splitter cannot be used, while a reflective component such as a mirror is used. Consequently, it is not possible to design such that incident light to the EUV mask and reflected light from the EUV mask proceed on the same axis. Therefore, usually, in the EUV lithography, EUV is made incident with its optical axis inclined at 6 degrees to the direction perpendicular to the EUV mask surface, and reflected light with its optical axis inclined at 6 degrees to the side opposite to the incident light is directed toward a semiconductor substrate.

CITATION LIST

Patent Literature

PTL 1: JP 2011-176162 A

SUMMARY OF INVENTION

Technical Problem

In this way, in the EUV lithography, since the optical axis is inclined, the incident light on the EUV mask generates a shadow of a mask pattern (a patterned light absorbing layer) of the EUV mask. The problem caused by the generation of the shadow is called the shadowing effect. The shadowing effect is the theoretical problem of the EUV lithography where the optical axis is inclined.

In a current EUV mask blank, a film having a film thickness of 60 to 90 nm and mainly containing tantalum (Ta) is used as a light absorbing layer. When exposure for pattern transfer is performed using an EUV mask produced from this mask blank, there is a possibility that the contrast is reduced at an edge portion in the shadow of a mask pattern depending on a relationship between the incident direction and the orientation of the mask pattern. Consequently, there is a possibility of occurrence of a problem such as an increase in the line edge roughness of a transferred pattern on a semiconductor substrate or a deviation of its line width from the target dimension, resulting in degradation of the transfer performance.

Further, for mass production in the future, EUV mask blanks and EUV masks are also required to improve the cleaning resistance of a light absorbing layer.

It is an object of the present invention to suppress or reduce the shadowing effect of a reflective photomask for pattern transfer using extreme ultraviolet light as a light source, thereby improving the performance of transfer to a semiconductor substrate, and to improve the cleaning resistance of a light absorbing layer.

Solution to Problem

In order to solve the above-described problems, a first aspect of the present invention is a reflective photomask blank for producing a reflective photomask for pattern transfer that uses light with a wavelength of an extreme ultraviolet region as a light source, the reflective photomask blank including: a substrate; a reflective layer formed on the substrate; and a light absorbing layer formed on the reflective layer. The light absorbing layer includes a tin oxide film with an atomic ratio (O/Sn) of oxygen (O) to tin (Sn) being more than 1.50 and equal to or less than 2.0, and with a film thickness of 25 nm or more and 45 nm or less.

A second aspect of the present invention is a reflective photomask including a substrate; a reflective layer formed on the substrate; and a light absorbing pattern layer formed on the reflective layer and patterned, the light absorbing pattern layer including a tin oxide film with an atomic ratio (O/Sn) of oxygen (O) to tin (Sn) being more than 1.50 and equal to or less than 2.0, and with a film thickness of 25 nm or more and 45 nm or less.

Advantageous Effects of Invention

According to the present invention, it can be expected that the shadowing effect of a reflective photomask for pattern transfer using extreme ultraviolet light as a light source is suppressed or reduced to improve the performance of transfer to a semiconductor substrate, and that the cleaning resistance of a light absorbing layer is improved.

DESCRIPTION OF EMBODIMENTS

Embodiment

Hereinafter, an embodiment of the present invention will be described, but the present invention is not limited to the embodiment described below. In the embodiment described below, limitation that is technically preferable for carrying out the present invention is made, but this limitation is not an essential feature of the present invention.

Figure 1:
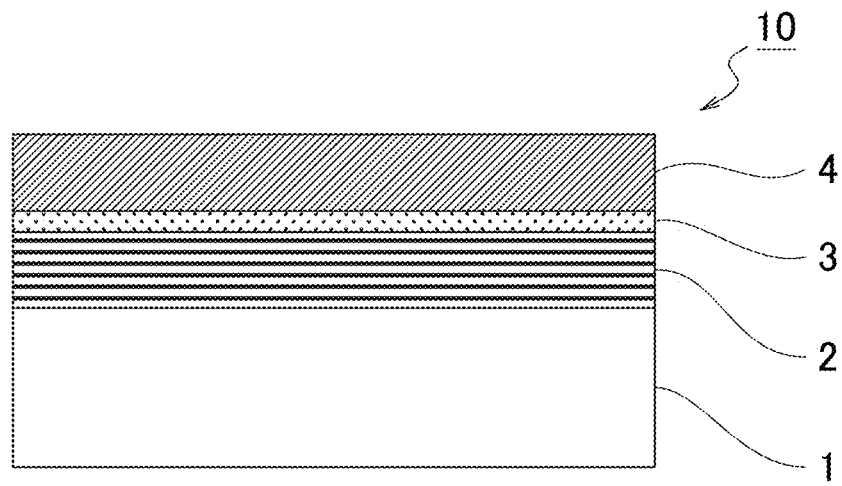
FIG. 1 is a sectional view illustrating a reflective photomask blank of an embodiment of the present invention.

As illustrated in FIG. 1, a reflective photomask blank 10 of this embodiment includes a substrate 1, a reflective layer 2 formed on the substrate 1, a capping layer 3 formed on the reflective layer 2, and a light absorbing layer 4 formed on the capping layer 3. The light absorbing layer 4 is composed of a tin oxide film in which the atomic ratio (O/Sn) of oxygen (O) to tin (Sn) is more than 1.50 and equal to or less than 2.0 and which has a film thickness of 25 nm or more and 45 nm or less. A substrate made of low-expansion synthetic quartz or the like is used as the substrate 1.

Figure 2:
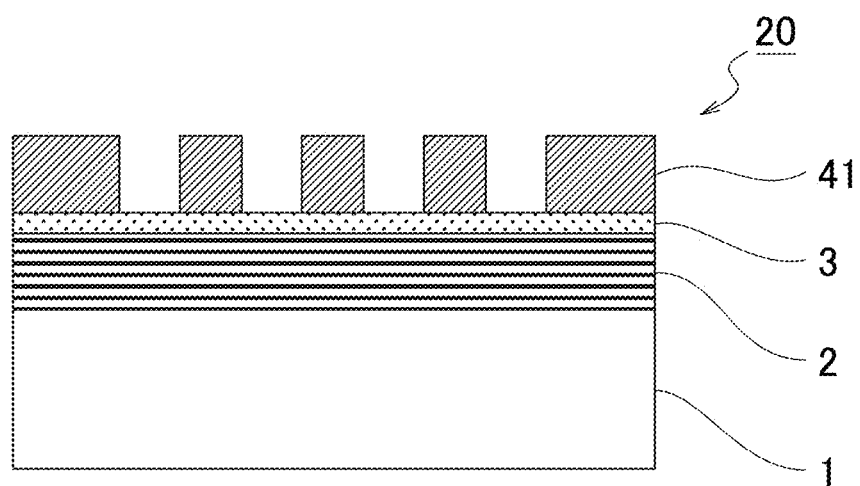
FIG. 2 is a sectional view illustrating a reflective photomask of the embodiment of the present invention.

As illustrated in FIG. 2, a reflective photomask 20 of this embodiment includes the substrate 1, the reflective layer 2 formed on the substrate 1, the capping layer 3 formed on the reflective layer 2, and a light absorbing pattern layer 41 formed on the capping layer 3. The light absorbing pattern layer 41 is composed of a tin oxide film in which the atomic ratio (O/Sn) of oxygen (O) to tin (Sn) is more than 1.50 and equal to or less than 2.0 and which has a film thickness of 25 nm or more and 45 nm or less. The light absorbing pattern layer 41 is formed by patterning the light absorbing layer 4 of the reflective photomask blank 10.

[Consideration for Reaching the Present Invention]

(About Light Absorbency of Absorbing Film)

A light absorbing layer (hereinafter also referred to simply as an "absorbing layer") of a reflective photomask blank is dry-etched and formed into a predetermined exposure transfer pattern and serves to absorb irradiated EUV. In order to reduce the shadowing effect, which is the problem to be solved, the absorbing layer should be made thin. However, when Ta (tantalum), which is the material generally used currently, is simply made thin, the absorbency for EUV is not sufficient so that the reflectance in an absorbing layer region becomes high. Therefore, in order to simultaneously achieve the film thinning of the absorbing layer and its light absorbency for EUV, a material having higher light absorbency for EUV than the existing absorbing layer material is required.

(About Drawback of High Absorption Material)

Figure 3:
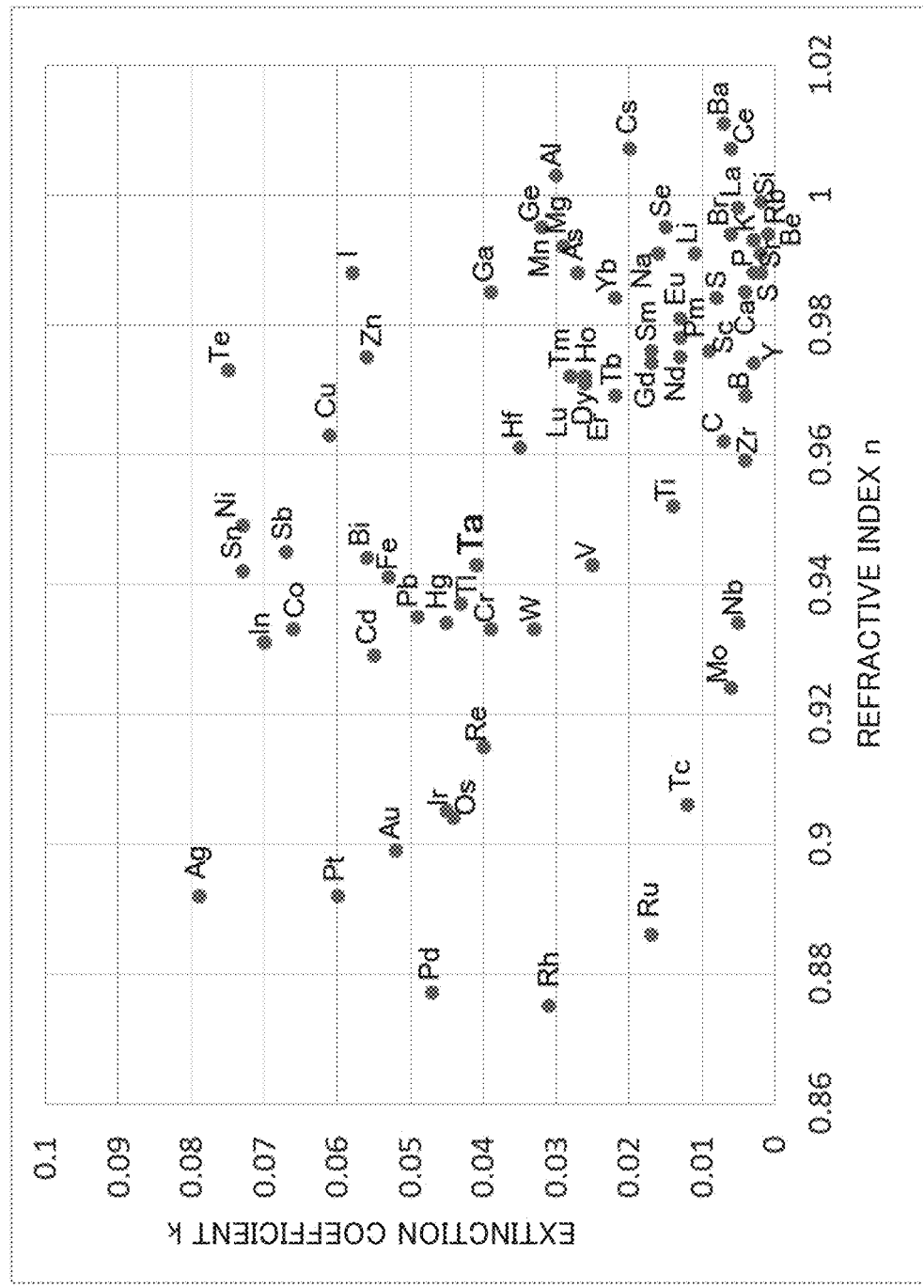
FIG. 3 is a graph illustrating optical constants of metal materials at the wavelength of EUV.

FIG. 3 illustrates optical constants of metal materials at the wavelength of the EUV region, wherein the abscissa axis represents the refractive index n and the ordinate axis represents the extinction coefficient k. There are Ag, Ni, Sn, Te, and the like as a material having a high extinction coefficient k. The extinction coefficients of these materials are in a range from 0.07 to 0.08 and are about twice the extinction coefficient 0.041 of Ta which is the conventional absorbing layer material. That is, these materials have high light absorbency. However, these high absorption materials cannot be patterned due to their poor dry-etchability (volatility of halides of these elements is low) or cannot withstand the heat at the time of producing a photomask or at the time of EUV exposure due to their low melting points, and therefore, most of them are not suitable for practical use as a light absorbing layer material of a photomask.

(About Relationship Between O/Sn Ratio and Melting Point of Tin Oxide Film and Between O/Sn Ratio and Chemical Resistance of Tin Oxide Film)

Figure 4:
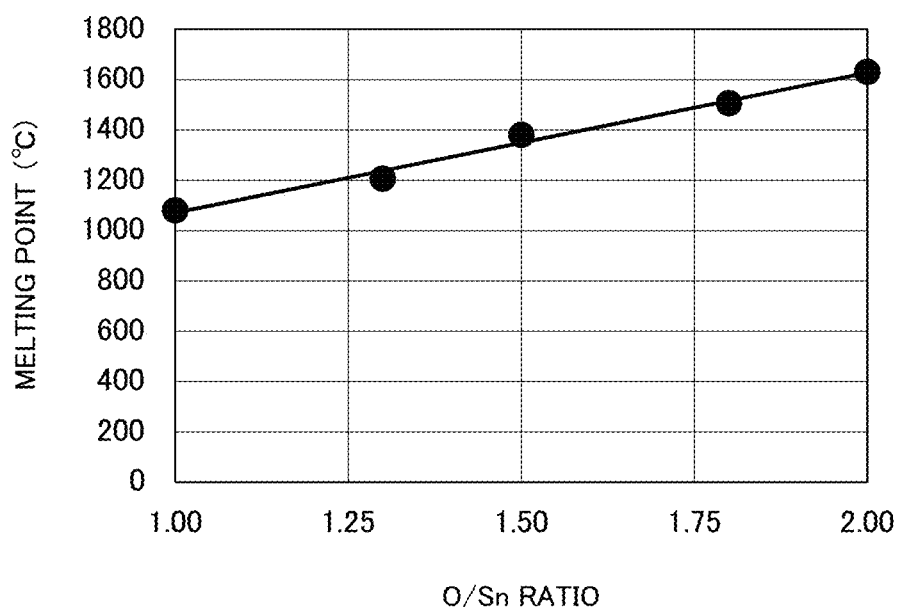
FIG. 4 is a graph illustrating the relationship between the ratio (O/Sn) of oxygen to tin contained in a tin oxide film and the melting point thereof.

In order to avoid such a drawback, it was decided to use a tin oxide film as a light absorbing layer of a reflective photomask blank and a reflective photomask. While a simple substance of Sn has a low melting point, around 230° C., and thus has a problem in thermal stability and cleaning resistance, the melting point can be significantly increased by using a tin oxide film. Actually, a plurality of tin oxide films with different O/Sn ratios was formed by reactive sputtering, and the melting points thereof were measured by a thermal analysis apparatus. As a result, as illustrated in FIG. 4, it was found that the greater the O/Sn ratio, the higher the melting point.

Next, the presence/absence of film loss of a light absorbing layer due to cleaning was confirmed for a plurality of samples prepared in the same manner as above.

The cleaning was performed by three types of methods, i.e. SPM (sulfuric-acid and hydrogen-peroxide mixture) cleaning, APM (ammonium hydrogen-peroxide mixture) cleaning, and strong cleaning.

Conditions of the SPM cleaning were set to sulfuric acid:hydrogen peroxide water=4:1 (volume ratio), a temperature of 100° C., and an immersion time of 90 minutes.

Conditions of the APM cleaning were set to ammonia: hydrogen peroxide water:water=1:1:5 (volume ratio), a temperature of 90° C., and an immersion time of 90 minutes.

In the strong cleaning, the SPM cleaning under the conditions described above and the APM cleaning under the conditions described above were continuously performed in this order in the state where ultrasonic wave in a megasonic band (1 MHz, 4W) was applied.

Then, for the presence/absence of film loss, the weight change of the sample before and after the cleaning was examined by measurement using an electronic analytical balance, and when there was a change in weight corresponding to a film thickness of 5 nm, it was determined that the film loss was "present".

As illustrated in Table 1, the film loss was observed due to the SPM cleaning in the tin oxide film with an O/Sn ratio of less than 1.50. Further, the film loss was observed due to the strong cleaning in the tin oxide film with an O/Sn ratio of 1.50 or less.

TABLE 1

| | O/Sn ratio | | | | | | | | |
|---|---|---|---|---|---|---|---|---|---|
| | 1.00 | 1.30 | 1.50 | 1.51 | 1.55 | 1.60 | 1.65 | 1.80 | 2.00 |
| SPM | present | present | absent | absent | absent | absent | absent | absent | absent |
| APM | absent | absent | absent | absent | absent | absent | absent | absent | absent |
| strong cleaning | present | present | present | absent | absent | absent | absent | absent | absent |

From these results, the following are clarified. The tin oxide film in which the atomic ratio (O/Sn) of oxygen to tin is more than 1.50 and equal to or less than 2.0 can have sufficient resistance to heat at the time of producing a photomask or at the time of EUV exposure and sufficient resistance to a cleaning solution (acid or alkali) and ultrasonic cleaning in a megasonic band at the time of producing a photomask.

Further, while the tin oxide film is chemically stable, it can be dry-etched with a chlorine-based gas and thus can be patterned. The reason for this is that volatility of $SnCl_4$, which is a compound of Sn and Cl, is higher than that of a compound of a high absorption material other than Sn and Cl.

(About Relationship Between O/Sn Ratio and Light Absorbency of Tin Oxide Film)

Optical constants (extinction coefficient and refractive index) for EUV hardly differ between tin oxide with an O/Sn ratio of 1.5 to 2.0 and tin alone. Therefore, using a tin oxide film with the O/Sn ratio of 1.5 to 2.0 as a light absorbing layer of a reflective photomask blank and a reflective photomask, it is possible to maintain the same light absorbency as when a light absorbing layer is Sn alone.

Actually, a plurality of tin oxide film samples in which the content of oxygen was changed in a range where the O/Sn ratio was 1.5 or more and 2.0 or less was prepared, and the optical constants thereof at a wavelength of 13.5 nm (EUV region) were measured. As a result, values were obtained for each of the samples such that refractive index n=0.930 to 0.935 and extinction coefficient k=0.0714 to 0.0721. These are values close to values of the simple substance of Sn illustrated in FIG. 3. That is, the optical constants of the tin oxide with the O/Sn ratio of 1.5 or more and 2.0 or less and the optical constants of the simple substance of Sn are approximately the same.

(Comparison of Reflectance, OD, and Film Thickness Between Ta Film and Tin Oxide Film)

Based on the average values (refractive index n=0.933, extinction coefficient k=0.0718) of the actually measured optical constants of the tin oxide films (the test samples with the O/Sn ratio of 1.5 or more and 2.0 or less), the EUV reflectance when using a light absorbing layer made of the tin oxide was calculated. Further, the OD value (Optical Density:contrast between an absorbing layer portion and a reflective layer portion) indicating the basic performance of a mask was calculated using the following formula (1).

$$OD = -\log(Ra/Rm) \quad (1)$$

In the formula (1), Rm is a reflected light intensity from a reflective layer region, and Ra is a reflected light intensity from a light absorbing layer region.

Naturally, in the EUV lithography, the higher the OD value, the better. Note that, using a mask blank having a configuration in which a capping layer (protective layer) having a thickness of 2.5 nm and made of Ru was present under the absorbing layer, 40 pairs of reflective layers each made of Si and Mo were present under the capping layer, a flat substrate made of synthetic quartz was present under the reflective layers, and a conductive layer made of CrN was present on a back surface of the substrate, the calculation was performed by using optical constants (refractive index and extinction coefficient) of these layers and changing the film thickness of the light absorbing layer.

Figure 5:
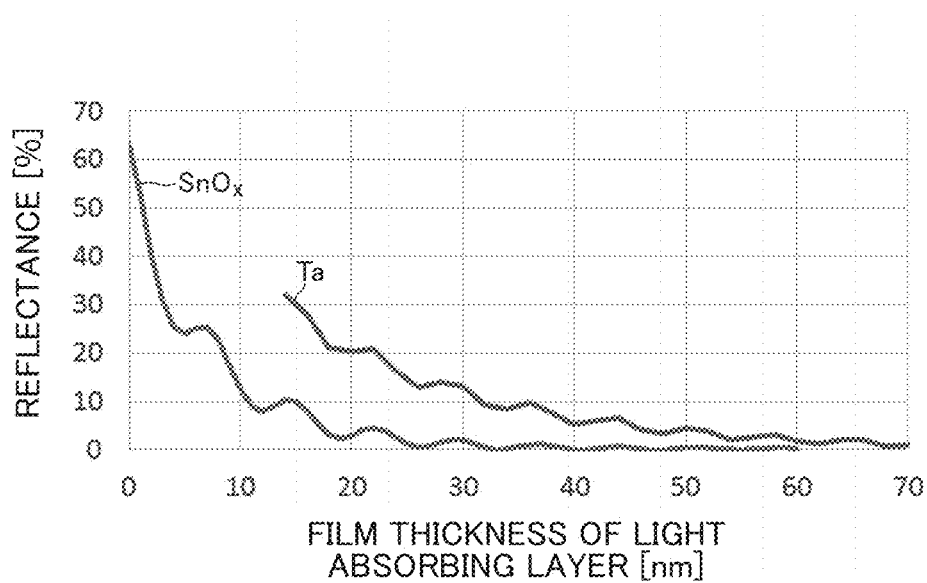
FIG. 5 is a graph illustrating the relationship between the film thickness of a light absorbing layer and the EUV reflectance thereof, which was obtained by calculation when the light absorbing layer was a tin oxide ($SnO_x$) film or a tantalum (Ta) film.

As seen from FIG. 5, in the case of a tin oxide ($SnO_x$) film, compared to a Ta film, for example, the reflectance can be reduced to half or less with the same film thickness, and the film thickness can be reduced to half or less with the same reflectance. In this way, the tin oxide film is effective as a light absorbing film.

Figure 6:
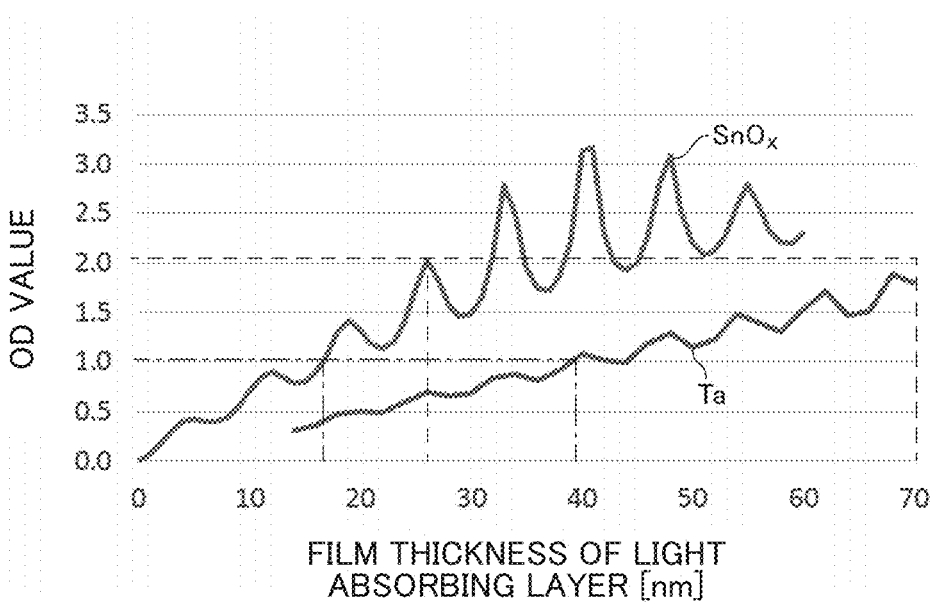
FIG. 6 is a graph illustrating the relationship between the film thickness of a light absorbing layer and the OD value, which was obtained by calculation when the light absorbing layer was a tin oxide ($SnO_x$) film or a tantalum (Ta) film.

As seen from FIG. 6, in order to obtain, for example, OD≥1.0, a Ta film requires a thickness of at least 40 nm or more, while a tin oxide ($SnO_x$) film requires only about 17 nm. Therefore, it is seen that, also in terms of the OD, the tin oxide film is effective as a light absorbing film that can reduce the film thickness.

In order to obtain, for example, OD=2.0, a Ta film requires a thickness of at least 70 nm or more, while a tin oxide film requires only 26 nm. Therefore, it is seen that, also at OD=2, the tin oxide film is effective as a light absorbing film that can reduce the film thickness.

In this way, using the tin oxide film, it is possible to thin the light absorbing layer while maintaining the OD value indicating the basic performance of the mask.

(Comparison of HV Bias Between Ta Film and Tin Oxide Film)

Next, in order to evaluate the influence of the shadowing effect, a comparison was made between a Ta film and a tin oxide film by simulation using a simulator according to the FDTD (Finite-Difference Time-Domain) method to observe the change in HV bias value when the film thickness was changed. The simulation conditions were such that the wavelength of a light source was set to 13.5 nm (EUV wavelength), NA was set to 0.33, the incident angle was set to 6 degrees, and a quasar was used for illumination.

The HV bias value is a line width difference of a transferred pattern that depends on the orientation of a mask pattern, i.e. a difference between a line width in the H (Horizontal) direction and a line width in the V (Vertical) direction. The line width in the H direction represents a line width in a direction parallel to a plane formed by incident light and reflected light, and the line width in the V direction represents a line width in a direction perpendicular to a plane formed by incident light and reflected light.

The horizontal pattern size is affected by the shadowing effect so that a reduction in contrast at an edge portion of a transferred pattern or a reduction in line width (Y-direction) thereof occurs. Since the pattern affected by the shadowing effect is reduced in line width after the transfer, the line width difference (i.e. HV bias) occurs between the vertical transferred pattern size and the horizontal transferred pattern size.

Figure 7:
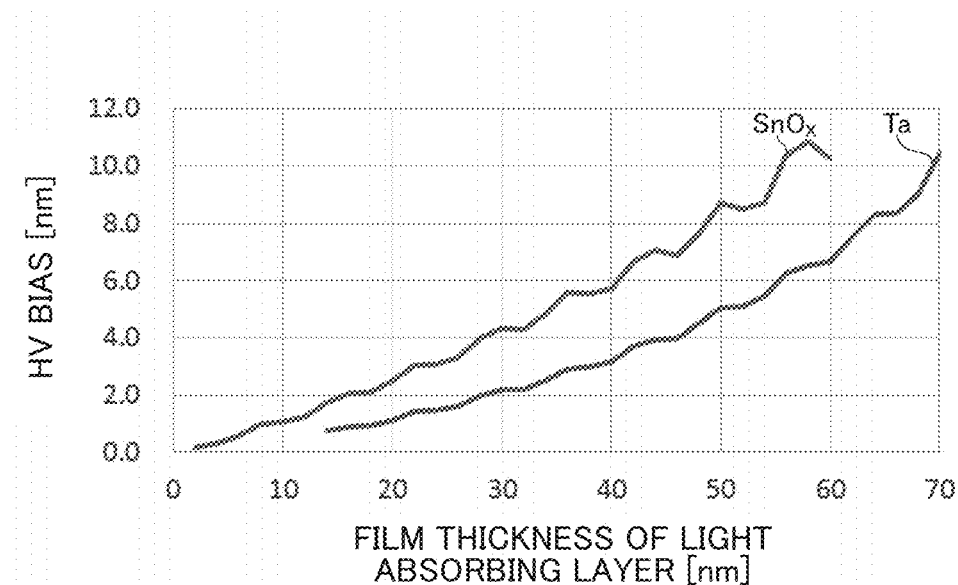
FIG. 7 is a graph illustrating the relationship between the film thickness of a light absorbing layer and the HV bias value of a pattern transferred by a photomask, which was obtained by calculation when the light absorbing layer was a tin oxide ($SnO_x$) film or a tantalum (Ta) film.

A pattern used in this simulation is a mask pattern designed to have a size of 16-nm LS (Line and Space are 1:1) on a semiconductor substrate. Therefore, since ¼ reduction projection exposure is usually used in the EUV lithography, the pattern size on an EUV mask is that of a 64-nm LS pattern. As illustrated in FIG. 7, it is seen that the HV bias value of the transferred pattern increases as the film thickness of the absorbing layer increases, for each of the Ta film and the tin oxide film.

Figure 8:
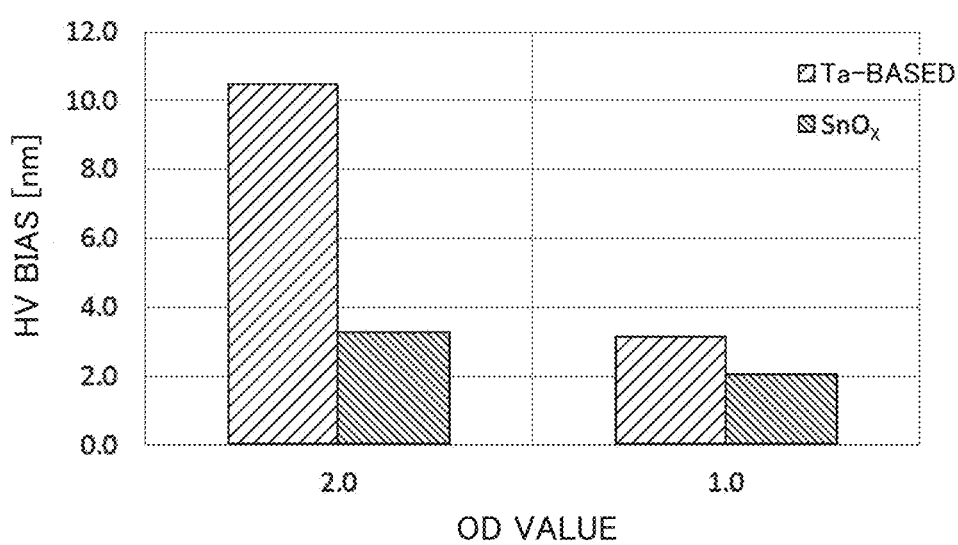
FIG. 8 is a graph illustrating the calculation results of HV bias values at OD values of 1.0 and 2.0, which were obtained when the light absorbing layer is a tin oxide ($SnO_x$) film or a tantalum (Ta) film.

Herein, as a result of comparison of HV bias values between a Ta film (film thickness 70 nm) and a tin oxide film (film thickness 26 nm) at OD=about 2, the HV bias value is 10.5 nm, i.e. very large, with the Ta film, while the HV bias value is 3.3 nm with the tin oxide film so that it is significantly reduced and improved (FIG. 8). Further, using a Ta film (40 nm) and a tin oxide film (17 nm) at OD=1, the HV bias is 3.2 nm with the Ta film and 2.1 nm with the tin oxide film.

In this way, it is seen that the influence of the shadowing effect (HV bias) can be significantly reduced by using tin oxide as a material of a light absorbing layer of a reflective photomask blank and a reflective photomask.

(Comparison of NILS Between Ta Film and Tin Oxide Film)

The influence of the shadowing effect also appears in pattern contrast called NILS (Normalized Image Log Slope). NILS is a characteristic value indicating an inclination between a light portion and a dark portion from a light intensity distribution of a transferred pattern. The greater the value, the better the pattern transfer properties (resolution, line edge roughness, etc.). Using optical constants of Ta and tin oxide forming light absorbing layers, NILS was evaluated by calculation (the same simulation as described above). The results are illustrated in FIG. 9.

Figure 9:
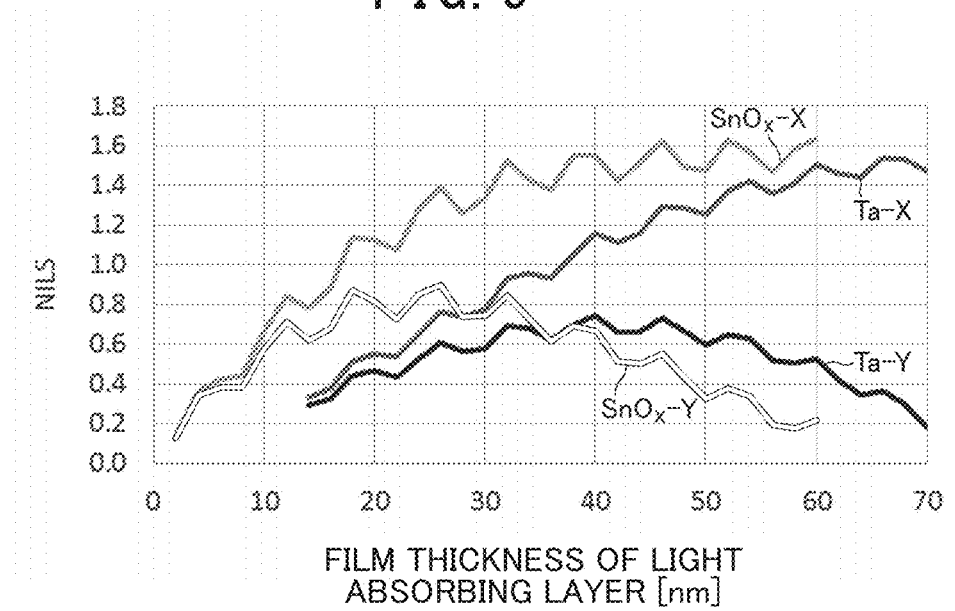
FIG. 9 is a graph illustrating the relationship between the film thickness of a light absorbing layer and the NILS (values in X- and Y-directions) of a pattern transferred by a photomask, which was obtained by calculation when the light absorbing layer was a tin oxide ($SnO_x$) film or a tantalum (Ta) film.

As illustrated in FIG. 9, in the case of a Ta film, with a film thickness of 70 nm where the OD becomes about 2, X (NILS in the vertical line width direction) is 1.5, and Y (NILS in the horizontal line width direction) is 0.2. That is, the NILS in the horizontal line width direction (Y-direction) that is affected by the shadowing effect is significantly degraded.

Such a large difference between the X- and Y-direction pattern contrasts (NILSs) causes the large HV bias value with the Ta film as described above.

On the other hand, in the case of a tin oxide film, with a film thickness of 26 nm where the OD becomes about 2, X=1.4 and Y=0.9. Since the NILS in the Y-direction is significantly improved, the HV bias value is also reduced.

As is obvious, the reduction in NILS (pattern contrast) in the Y-direction not only affects the HV bias, but also leads to an increase in the line edge roughness of a transferred pattern, and in the worst case, leads to the impossibility of resolution, which is a serious problem.

Figure 10:
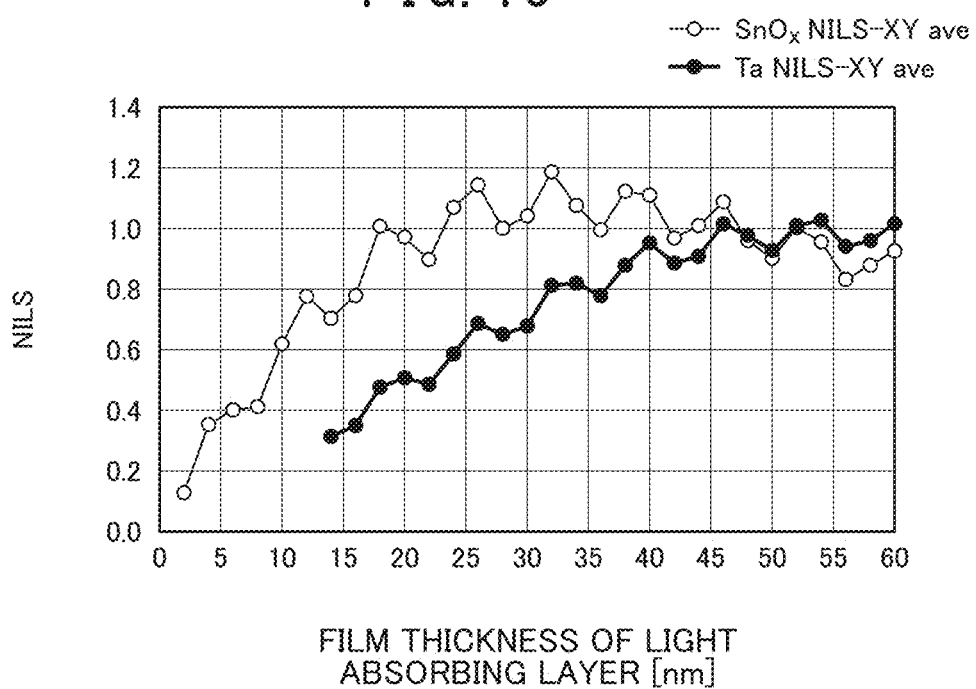
FIG. 10 is a graph illustrating the relationship between the film thickness of a light absorbing layer and the NILS (average of values in X- and Y-directions) of a pattern transferred by a photomask, which was obtained by calculation when the light absorbing layer was a tin oxide ($SnO_x$) film or a tantalum (Ta) film.

A graph of FIG. 10 illustrates the film thickness dependence of NILS (average of values in the X- and Y-directions) obtained by calculation (the same simulation as described above) in the case of a tin oxide film and a Ta film. From this figure, it is seen that the NILS decreases as the film thickness decreases, for each of the tin oxide film and the Ta film. The reason for this is that it is conjectured that when the absorbing film is thin, the reflectance in the absorbing film region becomes high to make the OD of a mask low, resulting in a reduction in NILS. Therefore, in order to obtain the value of NILS that is necessary for pattern transfer, a certain film thickness is required.

Further, from FIG. 10, it is also seen that when the film thickness is too large, the value of NILS decreases. It is conjectured that when the absorbing film is thick, the reflectance in the absorbing film region becomes low to make the OD of a mask large, but when the OD is 2 or more (i.e. the reflectance in the absorbing film region is 1% or less of the reflectance in the reflective layer region), since the reflectance in the absorbing film region is primarily small, even by further increasing the film thickness, there is no effect to increase the NILS. Rather than this, it is conjectured that when the absorbing film is too thick, the influence of obliquely incident EUV to generate a shadow of a mask pattern appears strongly at an edge portion of the mask pattern so that the NILS decreases.

In this way, it is seen that, in order to increase the NILS indicating pattern contrast, there is an optimum film thickness range.

As seen from FIG. 10, using a tin oxide film with a film thickness of 45 nm or less as a light absorbing layer of a reflective photomask blank and a reflective photomask, it is possible to increase the NILS (average of values in the X- and Y-directions) compared to the case where a Ta film is used. In the case of the Ta film, the optimum film thickness is approximately 45 nm or more, but the NILS does not exceed 1 with most of the film thicknesses equal to or more than 45 nm.

[About First Aspect and Second Aspect of the Present Invention]

A reflective photomask blank of a first aspect of the present invention and a reflective photomask of a second aspect of the present invention has a light absorbing layer including a tin oxide film with an atomic ratio (O/Sn) of oxygen (O) to tin (Sn) that is more than 1.50 and equal to or less than 2.0, and with a film thickness of 25 nm or more and 45 nm or less. As an example of the range of the atomic ratio (O/Sn) that is "more than 1.50 and equal to or less than 2.0", there can be cited "1.51 or more and 2.0 or less".

Since the light absorbing layer of the reflective photomask blank of the first aspect of the present invention and the reflective photomask of the second aspect of the present invention includes the tin oxide film with the film thickness of 25 nm or more and 45 nm or less, the influence of the shadowing effect can be made small compared to a reflective photomask blank and a reflective photomask having a light absorbing layer composed of a Ta film. As a result, high NILS (pattern contrast) is obtained so that an improvement in the resolution of a transferred pattern and a reduction in line edge roughness can be expected.

Further, since the film thickness of the tin oxide film is 25 nm or more and 45 nm or less, the influence of the shadowing effect can be made small compared to a reflective photomask blank and a reflective photomask having a light absorbing layer including a tin oxide film that does not satisfy the film thickness of 25 nm or more and 45 nm or less. Further, high cleaning resistance is ensured compared to a reflective photomask blank and a reflective photomask in which the atomic ratio (O/Sn) of a tin oxide film included in a light absorbing layer is 1.50 or less.

In the reflective photomask blank of the first aspect of the present invention and the reflective photomask of the second aspect of the present invention, a material forming the tin oxide film included in the light absorbing layer preferably contains 80 at % or more of tin (Sn) and oxygen (O) in total.

This is because when a component other than tin (Sn) and oxygen (O) is contained in the tin oxide film, the EUV absorbency by the tin oxide film is reduced, but when that component is less than 20 at %, a reduction in EUV absorbency is very small so that there is almost no reduction in performance as a light absorbing layer of an EUV mask.

As a material other than tin and oxygen, a metal such as Si, In, Te, Ta, Pt, Cr, or Ru, or a light element such as nitrogen or carbon may be mixed according to the purpose.

For example, by adding In to the tin oxide film, it is possible to impart conductivity to the film while ensuring the transparency, so that it is possible to enhance the inspectability in a mask pattern inspection using DUV light with a wavelength of 190 to 260 nm. Alternatively, when nitrogen or carbon is mixed to the tin oxide film, it is possible to increase the etching rate in dry etching of the tin oxide film.

As described above, according to the reflective photomask blank of the first aspect of the present invention and the reflective photomask of the second aspect of the present invention, by having the light absorbing layer including the tin oxide film with the film thickness of 25 nm or more and 45 nm or less, the influence of the shadowing effect can be reduced so that high NILS can be obtained compared to the conventional product having the light absorbing layer composed of the Ta film. Therefore, it is possible to realize an improvement in the resolution of a transferred pattern and a reduction in line edge roughness. Further, since the X- and Y-direction NILSs approach each other, the HV bias value can be reduced so that a transferred pattern faithful to a mask pattern can be obtained.

Example

Hereinafter, an Example of the present invention will be described.

(Production of Reflective Photomask Blank)

Figure 11:
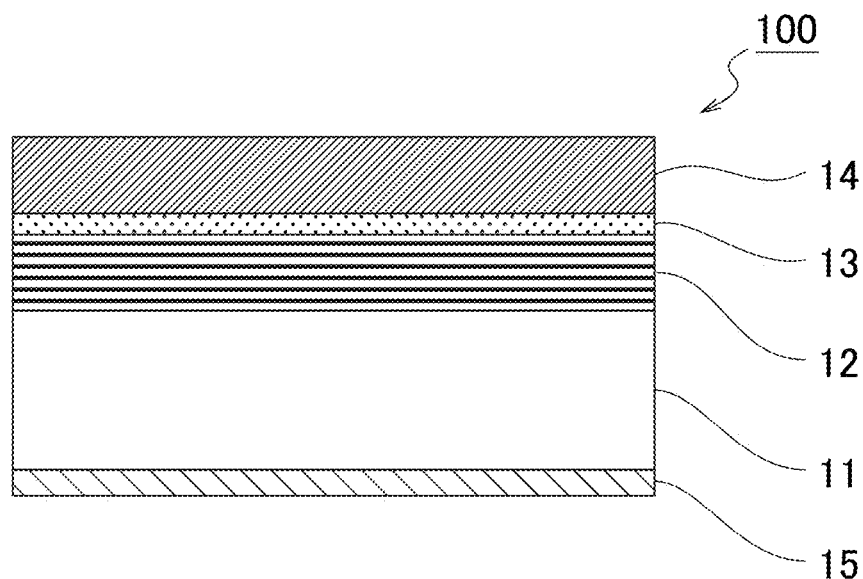
FIG. 11 is a sectional view illustrating a reflective photomask blank of an Example.

As a reflective photomask blank 100 with a layer structure illustrated in FIG. 11, a plurality of samples was produced in the following manner.

First, a reflective layer 12 of a multilayer structure composed of 40 pairs of Si and Mo (total film thickness 280 nm) was formed on a substrate 11 made of synthetic quartz, and a capping layer 13 composed of a Ru film was formed to a film thickness of 2.5 nm on the reflective layer 12. Then, a light absorbing layer 14 was formed on the capping layer 13. Then, a conductive layer 15 made of CrN was formed to a film thickness of 100 nm on a back surface of the substrate 11.

The light absorbing layer 14 was formed in each of the samples by changing the material (Ta or tin oxide) and the film thickness as indicated in Table 2. The tin oxide film was formed so that the O/Sn ratio became 2.00 or 1.51.

Each of the layers was formed using a sputtering apparatus. The tin oxide film was formed by a reactive sputtering method so that the O/Sn ratio became 2.00 or 1.51 by controlling the amount of oxygen introduced into a chamber during sputtering. The film thickness of each of the layers was measured by a transmission electron microscope, and the O/Sn ratio of the tin oxide film was measured by XPS (X-ray Photoelectron Spectroscopy).

(Production of Reflective Photomask)

Using each sample of the obtained reflective photomask blank 100, a reflective photomask was produced in the following manner.

Figure 12:
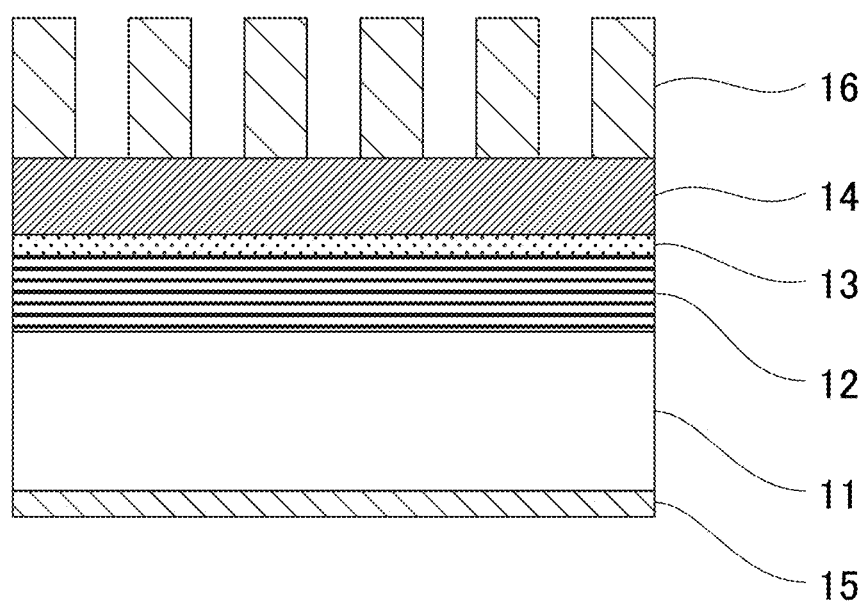
FIG. 12 is a sectional view for explaining one process of a method of producing a reflective photomask using the reflective photomask blank of the Example.

First, a positive chemically amplified resist (SEBP9012: manufactured by Shin-Etsu Chemical Co., Ltd.) was coated to a film thickness of 170 nm on the light absorbing layer 14 of the reflective photomask blank 100. Then, a predetermined pattern was written on this resist film using an electron beam writing apparatus (JBX3030: manufactured by Japan Electronics Co., Ltd.). Then, a prebaking treatment was performed at 110° C. for 10 minutes, and then a developing treatment was performed using a spray developing apparatus (SFG3000: manufactured by Sigmameltec Ltd.). Consequently, as illustrated in FIG. 12, a resist pattern 16 was formed on the light absorbing layer 14.

Figure 13:
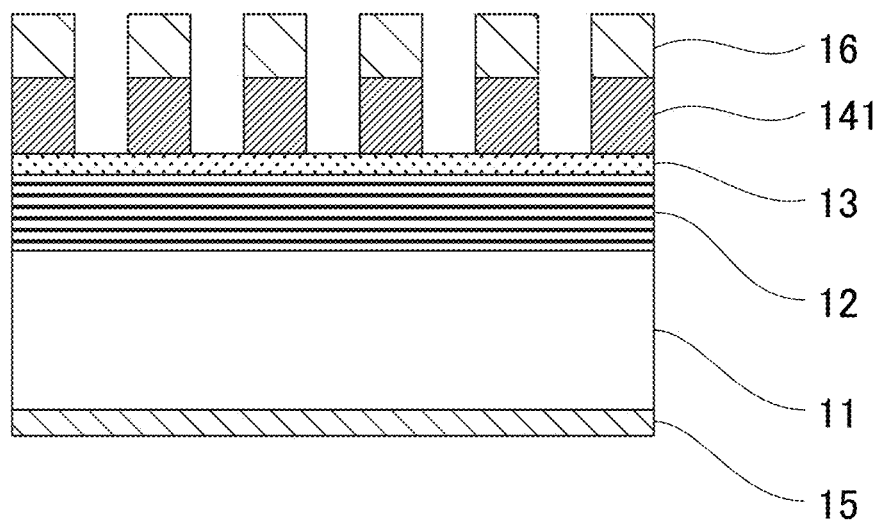
FIG. 13 is a sectional view for explaining a process subsequent to the process of FIG. 12 of the method of producing the reflective photomask using the reflective photomask blank of the Example.

Then, by dry etching using the resist pattern 16 as an etching mask, patterning of the light absorbing layer 14 was performed. In the sample in which the light absorbing layer 14 was the Ta film, an etching gas mainly composed of a fluorine-based gas was used. In the sample in which the light absorbing layer 14 was the tin oxide film, an etching gas mainly composed of a chlorine-based gas was used. Consequently, as illustrated in FIG. 13, the light absorbing layer 14 was made into a light absorbing pattern layer 141.

Figure 14:
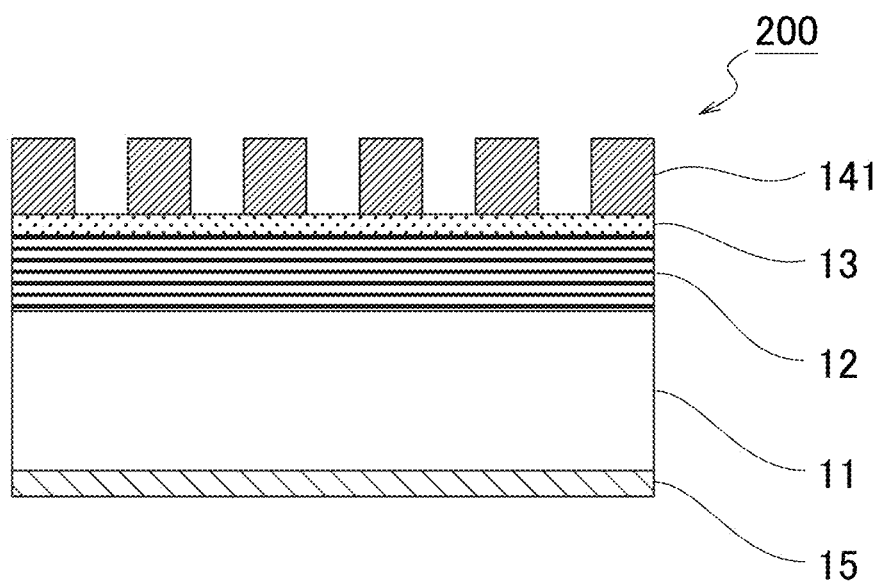
FIG. 14 is a sectional view illustrating a reflective photomask obtained in the Example.

Then, the resist pattern 16 was removed. Consequently, as illustrated in FIG. 14, each sample of a reflective photomask 200 was obtained in which the reflective layer 12 of the multilayer structure composed of the 40 pairs of Si and Mo (total film thickness 280 nm), the capping layer 13 composed of the 2.5-nm Ru film, and the light absorbing pattern layer 141 were formed in this order on the surface of the substrate 11 made of synthetic quartz, and the conductive layer 15 was formed on the back surface of the substrate 11 made of synthetic quartz.

(Wafer Exposure)

Using each sample of the obtained reflective photomask 200, a pattern of the light absorbing pattern layer 141 was transferred to an EUV positive chemically amplified resist film formed on a wafer, by exposure using an EUV exposure apparatus (NXE3300B manufactured by ASML Inc.).

(Resolution and Line Edge Roughness of Transferred Pattern)

The resist pattern on the wafer thus formed was observed by an electron beam dimension measuring apparatus, thereby performing the measurement of the line edge roughness. The results are indicated in Table 2.

TABLE 2

| Material | absorbing film measured value | | | pattern contrast n, k, calculated from | transferred pattern (measured by SEM observation) | |
|---|---|---|---|---|---|---|
| | refractive index n | extinction coefficient k | film thickness | film thickness NILS (X, Y average) | resolution | line edge roughness |
| Ta | 0.94 | 0.041 | 30 nm | 0.68 | unresolved | — |
| | | | 41 nm | 0.90 | partially disconnected | 6.5 nm |
| | | | 50 nm | 0.95 | OK | 4.8 nm |
| | | | 61 nm | 1.00 | OK | 4.0 nm |
| | | | 70 nm | 0.91 | partially disconnected | 4.1 nm |
| SnO O/Sn ratio = 2.00 | 0.93 | 0.071 | 10 nm | 0.60 | unresolved | 5.8 nm |
| | | | 20 nm | 0.98 | partially disconnected | 4.1 nm |
| | | | 22 nm | 0.90 | OK | 4.0 nm |
| | | | 24 nm | 1.07 | OK | 3.9 nm |
| | | | 25 nm | 1.11 | OK | 3.5 nm |
| | | | 27 nm | 1.08 | OK | 3.6 nm |
| | | | 32 nm | 1.21 | OK | 3.2 nm |
| | | | 37 nm | 1.08 | OK | 3.2 nm |
| | | | 45 nm | 1.05 | OK | 3.4 nm |
| | | | 51 nm | 0.95 | OK | 4.4 nm |
| | | | 60 nm | 0.90 | partially disconnected | 4.8 nm |
| SnO O/Sn ratio = 1.51 | 0.94 | 0.071 | 25 nm | 1.11 | OK | 3.5 nm |
| | | | 27 nm | 1.07 | OK | 3.5 nm |
| | | | 32 nm | 1.19 | OK | 3.2 nm |
| | | | 37 nm | 1.06 | OK | 3.2 nm |
| | | | 45 nm | 1.04 | OK | 3.3 nm |

As indicated in Table 2, when the reflective photomask having the SnO film with the O/Sn ratio of 2.00 or 1.51 and with the film thickness of 25 nm or more and 45 nm or less as the light absorbing layer was used, there was no problem in resolution and the line edge roughness was 3.6 nm or less. This value was lower than that when the reflective photomask having the Ta film as the light absorbing layer was used.

That is, it was found that the good results were obtained by using the reflective photomask having the SnO film with the O/Sn ratio of 2.00 or 1.51 and with the film thickness of 25 nm or more and 45 nm or less as the light absorbing layer. Further, when the reflective photomask having the SnO film with the O/Sn ratio of 2.00 or 1.51 and with the film thickness of 32 nm or more and 45 nm or less as the light absorbing layer was used, the line edge roughness was 3.4 nm or less, and therefore, it was found that the better results were obtained in this case.

From the results described above, it is confirmed that the lithography characteristics (resolution, line edge roughness) of a transferred pattern are improved compared to conventional ones by using the reflective photomask blank of the first aspect of the present invention and the reflective photomask of the second aspect of the present invention.

REFERENCE SIGNS LIST

1 substrate
2 reflective layer
3 capping layer
4 light absorbing layer
41 light absorbing pattern layer
11 substrate
12 reflective layer
13 capping layer
14 light absorbing layer
141 light absorbing pattern layer
15 conductive layer
16 resist pattern
10 reflective photomask blank
20 reflective photomask
100 reflective photomask blank
200 reflective photomask

The invention claimed is:

1. A reflective photomask blank for producing a reflective photomask for pattern transfer using extreme ultraviolet light as a light source, the reflective photomask blank comprising:
    a substrate;
    a reflective layer including a multilayer film and formed on the substrate; and
    a light absorbing layer formed on the reflective layer,
    wherein the light absorbing layer includes a tin oxide film with an atomic ratio (O/Sn) of oxygen (O) to tin (Sn) being more than 1.50 and equal to or less than 2.0, and with a film thickness of 25 nm or more and 45 nm or less.

2. The reflective photomask blank according to claim 1, wherein the film thickness of the tin oxide film is 32 nm or more and 45 nm or less.

3. The reflective photomask blank according to claim 1, wherein a material forming the tin oxide film contains 80 at % or more of tin (Sn) and oxygen (O) in total.

4. The reflective photomask blank according to claim 1, further comprising a capping layer formed between the light absorbing layer and the reflective layer.

5. A reflective photomask comprising:
    a substrate;
    a reflective layer formed on the substrate; and
    a light absorbing pattern layer formed on the reflective layer and patterned, the light absorbing pattern layer including a tin oxide film with an atomic ratio (O/Sn) of oxygen (O) to tin (Sn) being more than 1.50 and equal to or less than 2.0, and with a film thickness of 25 nm or more and 45 nm or less.

6. The reflective photomask blank according to claim 2, wherein a material forming the tin oxide film contains 80 at % or more of tin (Sn) and oxygen (O) in total.

7. The reflective photomask blank according to claim 2, further comprising a capping layer formed between the light absorbing layer and the reflective layer.

8. The reflective photomask blank according to claim 3, further comprising a capping layer formed between the light absorbing layer and the reflective layer.

* * * * *